United States Patent
Yiu et al.

(10) Patent No.: US 9,853,074 B2
(45) Date of Patent: Dec. 26, 2017

(54) CHIP SCALE SENSING CHIP PACKAGE

(71) Applicant: XINTEC INC., Taoyuan (TW)

(72) Inventors: Ho-Yin Yiu, Hsinchu (TW); Chi-Chang Liao, Pingtung (TW); Shih-Yi Lee, Taoyuan (TW); Yen-Kang Raw, Zhunan Township (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/410,715

(22) Filed: Jan. 19, 2017

(65) Prior Publication Data

US 2017/0213865 A1    Jul. 27, 2017

(30) Foreign Application Priority Data

Jan. 27, 2016    (TW) .............................. 105201211 U

(51) Int. Cl.
*H01L 27/146*    (2006.01)

(52) U.S. Cl.
CPC .... *H01L 27/14621* (2013.01); *H01L 27/1462* (2013.01); *H01L 27/14627* (2013.01); *H01L 27/14636* (2013.01); *H01L 27/14685* (2013.01)

(58) Field of Classification Search
CPC ................................................ H01L 27/14687
USPC ......................................................... 257/432
See application file for complete search history.

(56) References Cited

U.S. PATENT DOCUMENTS

| 8,034,652 B2 * | 10/2011 | Nishida ............. H01L 27/14618 438/294 |
| 8,604,435 B2 * | 12/2013 | Meinel ............. H01L 27/14649 250/338.1 |
| 9,006,850 B2 * | 4/2015 | Hsieh .................... H01L 25/167 257/432 |

* cited by examiner

*Primary Examiner* — Chandra Chaudhari
(74) *Attorney, Agent, or Firm* — Liu & Liu

(57) ABSTRACT

This present invention provides a chip scale sensing chip package, comprising: a sensing chip with a first top surface and a first bottom surface opposite to each other, comprising: a sensing device adjacent to the first top surface; and a plurality of conductive pads adjacent to first top surface and the sensing device; a wiring layer formed on the first bottom surface and connected to each of the conductive pads; a dam having a supporter with a first opening and a spacer with a second opening formed on the first top surface, wherein the supporter is within the second opening and adjacent to the spacer, and the spacer is higher than the supporter by a predetermined distance d; a lens formed on the first top surface exposed by the first opening and above the sensing device; and an optical filter deposed on the supporter and above the lens.

10 Claims, 6 Drawing Sheets

CHIP SCALE SENSING CHIP PACKAGE

This application claims the benefit of TW provisional application No. 105201211, filed on Jan. 27, 2016, and the entirety of which is incorporated by reference herein.

BACKGROUND OF THE INVENTION

Field of the Invention

The present invention relates to a sensing chip package and in particular relates to a chip scale sensing chip package.

Description of the Related Art

The photo sensing device or light emitting device plays an important role in the application of image capture or illumination, for example, mobile electronic devices such as digital cameras, digital video recorders and mobile phones, or consuming devices such as solar cells, monitors and lighting fixtures. With the developments of lighter electronic devices, the sizes of the photo sensing devices are shrink smaller. The semiconductor chip was packaged in an opaque package by the conventional semiconductor package to avoid the semiconductor chip contamination and impact caused by the environment. Contrarily, the photo sensing device such as CMOS image sensor or photodiode device must be packaged in a package with at least one transparent substrate such as glass on the top to receive the ambient light or output light. Therefore, the whole bottom of the transparent substrate was coated with an adhesive layer to bond to wafer with photo sensing devices or light emitting devices formed thereon to finish the package. However, the adhesive layer might result in light refraction and affect the receiving or output of the light. In order to resolve this advantage, a new design was developed by forming a cavity established by a dam to support the transparent substrate, wherein the dam was used to replace the above-mentioned adhesive layer coated on whole bottom of the transparent substrate to adhere the transparent on the photo sensing device by just coating the adhesive layer on the dam. Accordingly, the sensitivity of the photo sensing device can be highly enhanced because the light is received or emitted by the photo sensing device by passing through the cavity of the dam and the transparent substrate instead the adhesive layer with a poor light transmittance.

As mentioned above, the ambient light is received by the photo sensing device such as CMOS image sensor or photodiode device, and the IR in the ambient light usually causes the damage of the photo sensing device. Therefore, an additional optical filter is necessary to depose above the photo sensing device to filter the IR. However, the gap between the transparent substrate and the photo sensing device must be maintained at a predetermined distance to avoid the so-called ghost image caused by the dusts fallen on the transparent substrate which will increase the thickness of the result photo sensing device package and result in failure of demand of size shrinkage.

Accordingly, a chip scale photo sensing device package which is free from being damaged by IR is highly expected.

SUMMARY OF THE INVENTION

A feature of this invention provides a chip scale sensing chip package, comprising: a sensing chip with a first top surface and a first bottom surface opposite to each other, comprising: a sensing device adjacent to the first top surface; and a plurality of conductive pads adjacent to first top surface and the sensing device; a wiring layer formed on the first bottom surface and connected to each of the conductive pads; a dam having a supporter with a first opening and a spacer with a second opening formed on the first top surface, wherein the supporter is within the second opening and adjacent to the spacer, and the spacer is higher than the supporter by a predetermined distance d; a lens formed on the first top surface exposed by the first opening and above the sensing device; and an optical filter formed on the supporter and above the lens.

Another feature of this invention provides a chip scale sensing chip package as mentioned above, wherein the wiring layer comprises: a plurality of first through holes formed on the first bottom surface, wherein each of the first through holes corresponds to one of the conductive pads and has a bottom wall exposing one of the conductive pads and a sidewall surrounding the bottom wall; an insulating layer formed on the first bottom surface and overlaid the sidewall and the bottom wall of each first through hole; a plurality of second through hole passing through the insulating layer on each of the first through holes and exposing one of the conductive pads corresponding thereof a re-distribution layer formed on the insulating layer and electrically connected to each of the conductive pads via each first through hole and each second through hole; a passivation layer formed on the re-distribution layer and having a plurality of third through holes exposing the re-distribution layer; and a plurality conductive structures respectively formed in each of the third through holes to respectively interconnected to re-distribution layer.

Another feature of this invention provides a chip scale sensing chip package as mentioned above, wherein the conductive structures are selected from solder balls, solder bumps or conductive pillars, or combination thereof.

Another feature of this invention provides a chip scale sensing chip package as mentioned above, further comprising a first adhesive layer sandwiched between the chip scale sensing chip and the dam.

Another feature of this invention provides a chip scale sensing chip package as mentioned above, further comprising a third adhesive layer sandwiched between the lens and the supporter of the dam.

Another feature of this invention provides a chip scale sensing chip package as mentioned above, wherein the dam is manufactured by photolithography and etching, molding or injection molding.

Another feature of this invention provides a chip scale sensing chip package as mentioned above, wherein the dam is made of a material comprising silicon.

Another feature of this invention provides a chip scale sensing chip package as mentioned above, wherein the optical filter is an IR-filtering glass.

Another feature of this invention provides a chip scale sensing chip package as mentioned above, wherein the cross-section areas of each first through hole are increased from the first top surface to the first bottom surface.

Another feature of this invention provides a chip scale sensing chip package as mentioned above, wherein the cross-sectional areas of each first through hole from the first top surface to the first bottom surface are substantial the same.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific exemplary embodiments discussed are merely illustrative of specific methods to make and use the embodiments, and do not limit the scope of the disclosure.

Exemplary Embodiment 1

A detailed description of the chip scale sensing chip package and a method of manufacturing the same according to embodiment 1 of this invention is given below with reference to the accompany FIGS. 1A~1L.

Figure 1A:
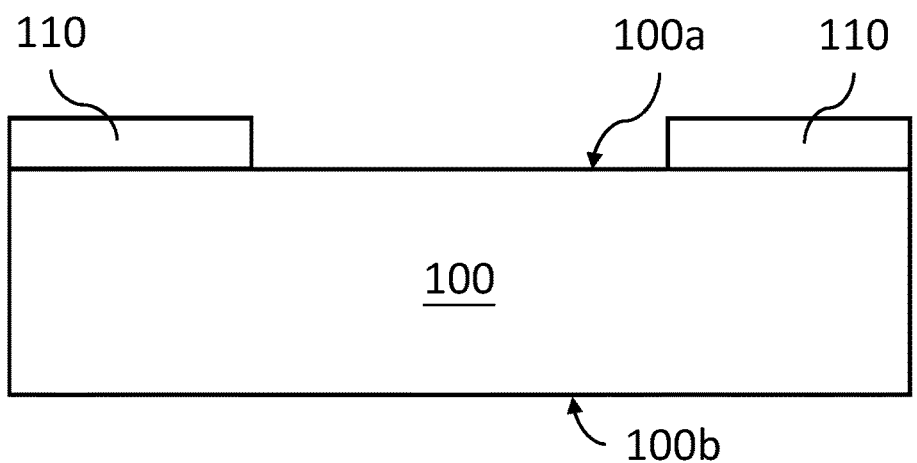
FIGS. 1A~1L are cross-sectional views of a method of manufacturing a chip scale sensing chip package according to the exemplary embodiment 1 of this present invention.

First, please refer to FIG. 1A. A semiconductor wafer 100 with a top surface 100a and a bottom surface 100b was provided. Next, a photoresist pattern 110 was formed on the top surface 100a of the semiconductor wafer 100 to mask part of the top surface 100a. The semiconductor wafer 100 of this embodiment is a silicon wafer, and other semiconductor wafers can also be chosen in other embodiments of this invention.

Figure 1B:
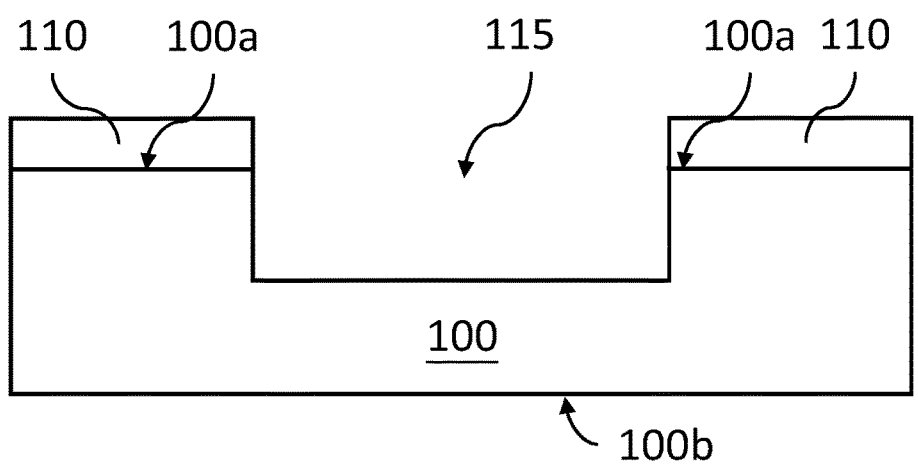

Next, please refer to FIG. 1B. The top surface 100a of the semiconductor wafer 100 not masked by the photoresist pattern 110 was removed by etching to form a plurality of concaves 115 on the top surface 100a.

Figure 1C:
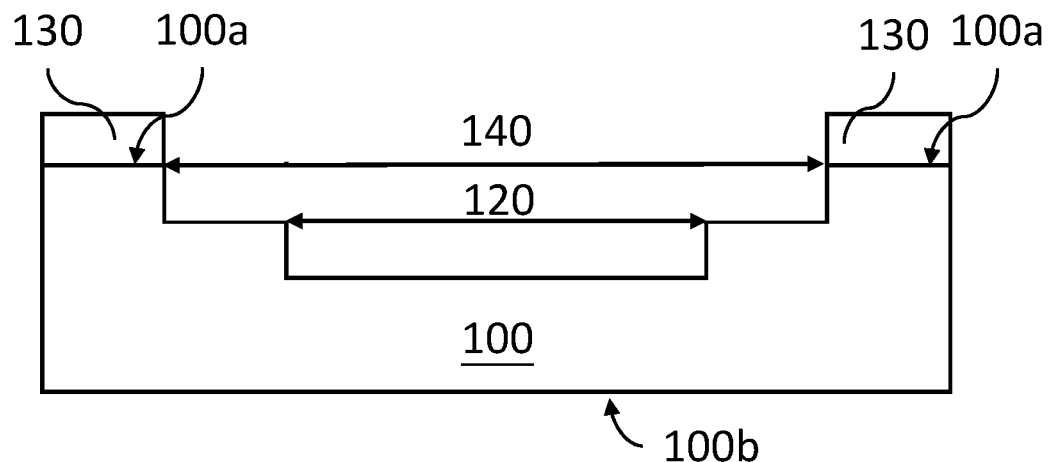
Figure 1D:
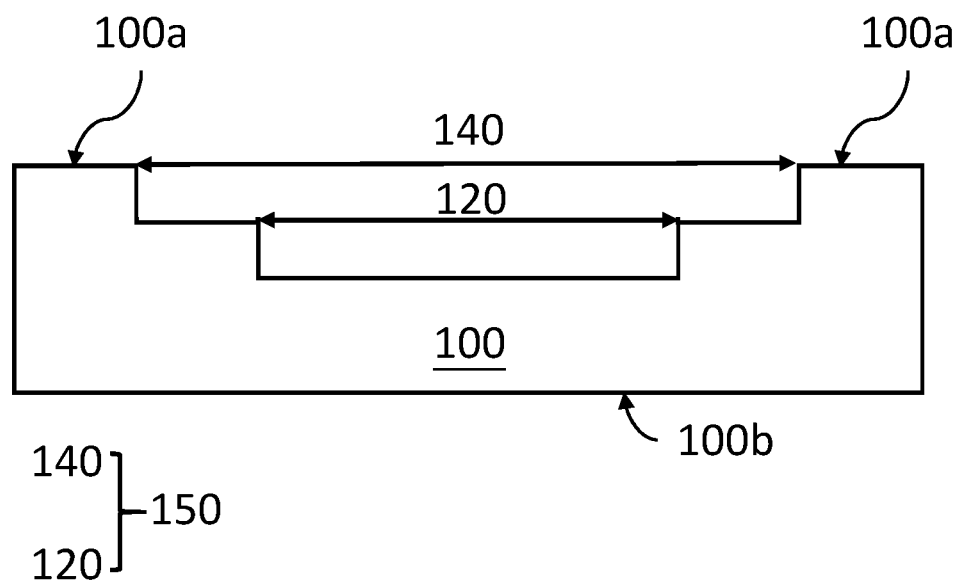

Next, please refer to FIG. 1C. The photoresist pattern 110 was removed. Then, another photoresist pattern 130 was formed on the top surface 100a of the semiconductor wafer 100 adjacent to the concaves 115. The top surface 100a within the concaves 115 and adjacent to the edge of each concave not masked by the photoresist pattern 130 was etched away to form a first opening 120 adjacent to the bottom surface 100b and a second opening 140 above the first opening 120. The cross-sectional area of the second opening 140 is greater than that of the first opening 120. A plurality of concaves 150 as illustrated in FIG. 1D were formed on the top surface 100a of the semiconductor wafer 100 after removing the photoresist pattern 130, wherein each of the concaves 150 comprises a first opening 120 and a second opening 140 above thereof.

Figure 1E:
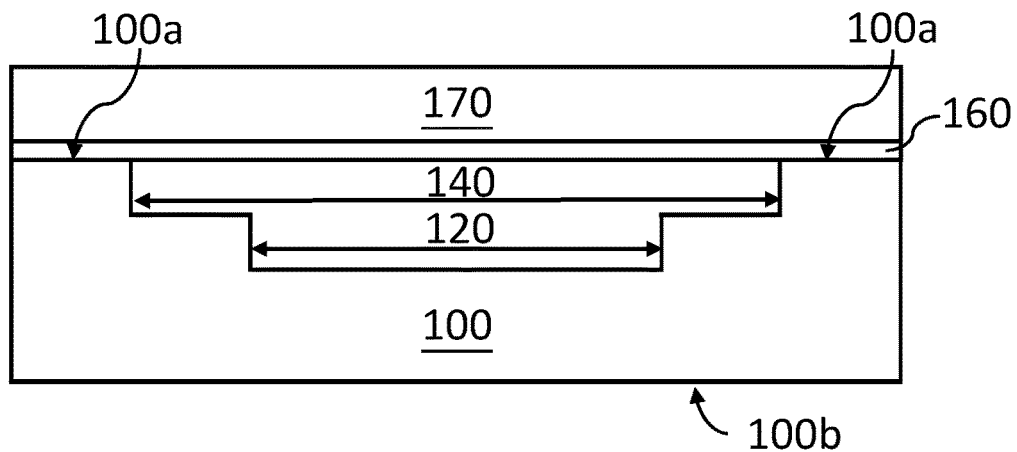

Next, please refer to FIG. 1E. A temporary substrate 170 was provided, and the semiconductor wafer 100 was bonded the top surface 100a to the temporary substrate 170 by sandwiching a second adhesive layer 160 therebetween.

Figure 1F:
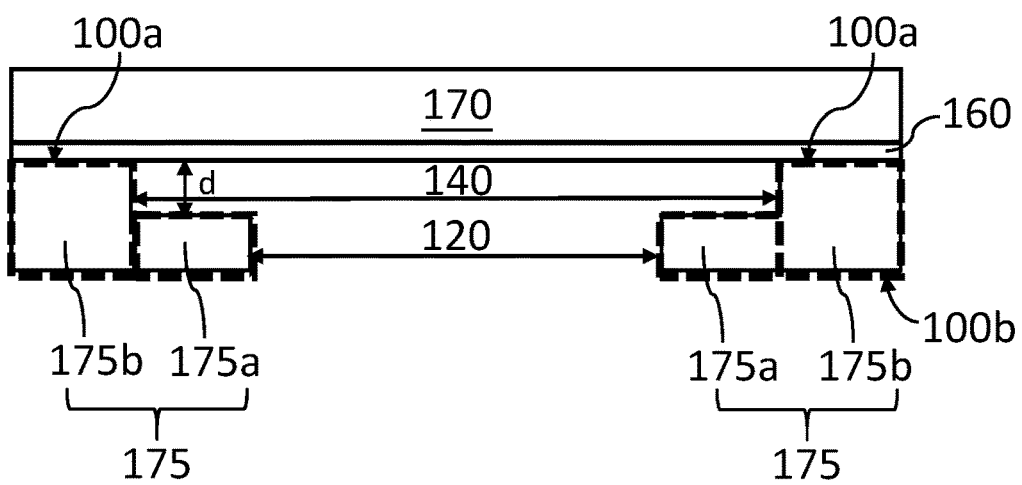

Next, please refer to FIG. 1F. The bottom surface 100b of the semiconductor wafer 100 was polished until the first through holes 120 passing through the bottom surface 100b of the semiconductor wafer 100 to form dams 175 on the temporary substrate 170. Each dam 175 comprises a supporter 175a with a first opening 120 and a spacer 175b with a second opening 140, wherein the supporter 175a is within the second opening 140 and adjacent to the spacer 175b, and the spacer 175b is higher than the supporter 175a by a predetermined distance d.

Figure 1G:
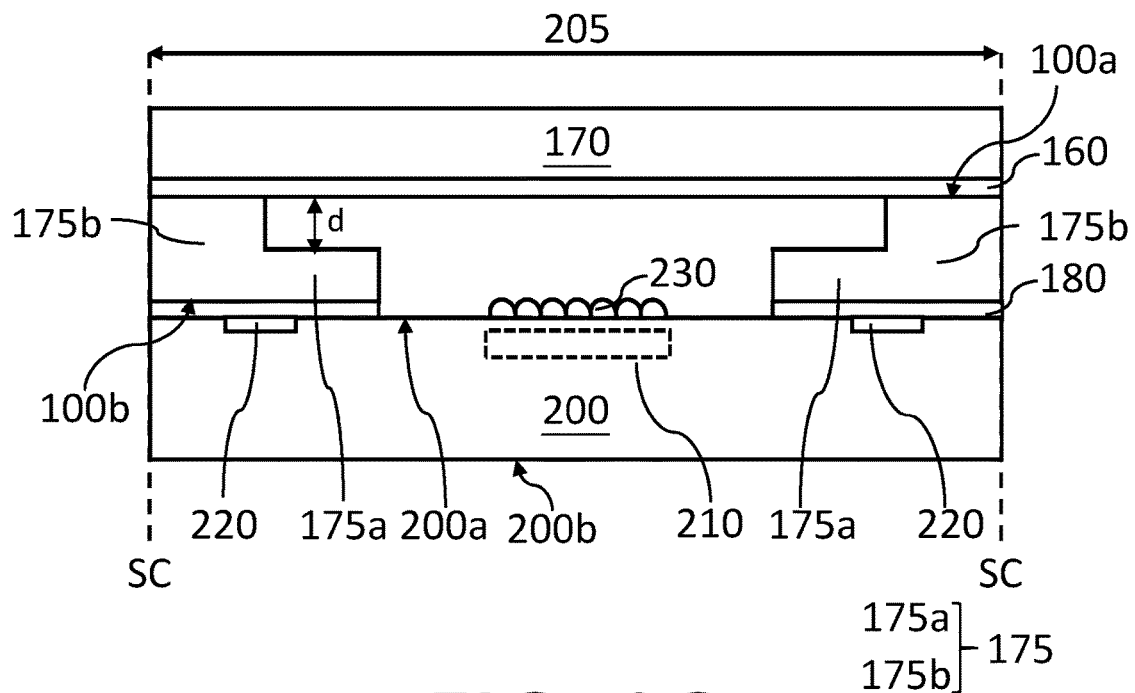

Next, please refer to FIG. 1G. A sensing chip device wafer 200 with a plurality of chip regions 205 spaced with each other by scribing channels (SC) was provided. Each chip region 205 having a first top surface 200a and a first bottom surface 200b comprises a sensing device 210 adjacent to the first top surface 200a and a plurality of conductive pads 220 adjacent to first top surface 200a and the sensing device 210. Next, a lens 230 was provided above the sensing device 210 and formed on the first top surface 200a. Then, the bottom surface 100b of the dam 175 as shown in FIG. 1F was bonded to the first top surface 200a by a first adhesive layer 180.

Figure 1H:
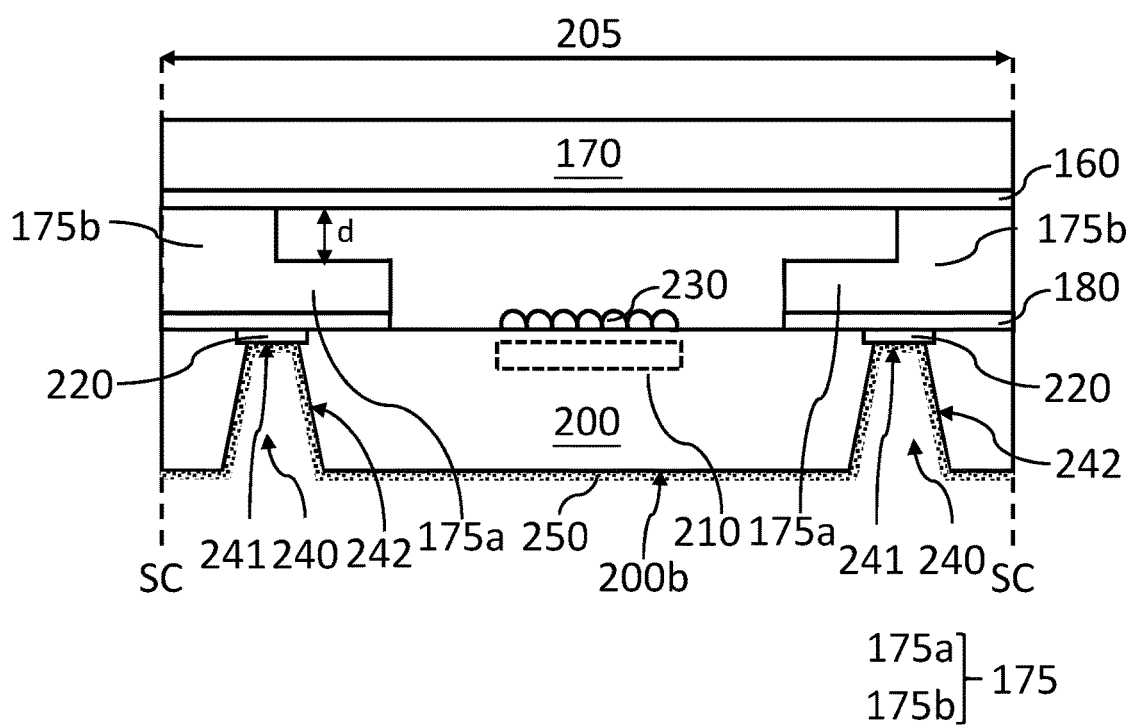

Next, please refer to FIG. 1H. The first bottom surface 200b was thinned by etching, milling or polishing. Then a plurality of first through holes 240 were formed on the first bottom surface 200b, wherein each first through hole 240 corresponding to one of the conductive pads 220 comprises a bottom wall 241 exposing the conductive pad 220 and a sidewall 242 surrounding the bottom wall. The cross-sectional areas of each first through hole 240 can be increased from the first top surface 200a to the first bottom surface 200b or substantially the same. Next, an insulating layer 250 was formed on the first bottom surface 200b and overlaid the sidewall 242 and the bottom wall 241 of each first through hole 240. The insulating layer 250 of this embodiment is consisted of silicon oxide, and other dielectric materials such as silicon nitride or silicon oxynitride can also be chosen as the insulating layer 250 in other embodiments of this invention.

Figure 1I:
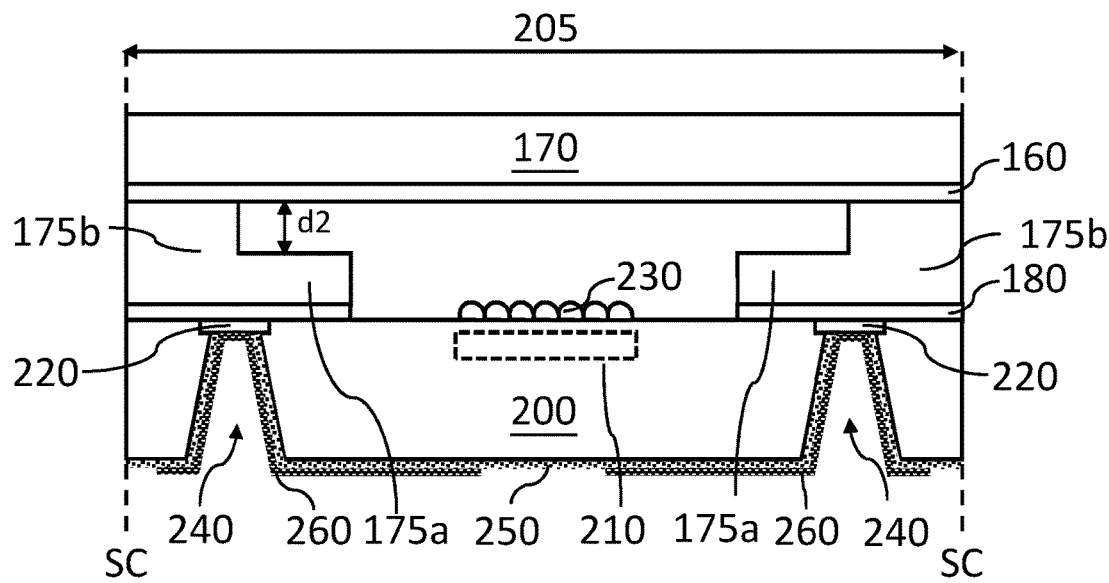

Next, please refer to FIG. 1I. A plurality of second through holes (not shown) passing through the insulating layers 250 on the bottom walls 241 of the first through holes 240 and exposing the conductive pads 220 corresponding thereof were formed. Next, a re-distribution layer (RDL) 260 was formed on the insulating layer 250 and electrically connected to each of the conductive pads 220 via each first through hole 240 and each second through hole (not shown). The re-distribution layer 260 of this embodiment can be selected from one of the group consisted of aluminum, copper, gold, platinum, nickel, tin, conductive polymer and conductive ceramics such as indium tin oxide (ITO) or indium zinc oxide (IZO) or combination thereof.

Figure 1J:
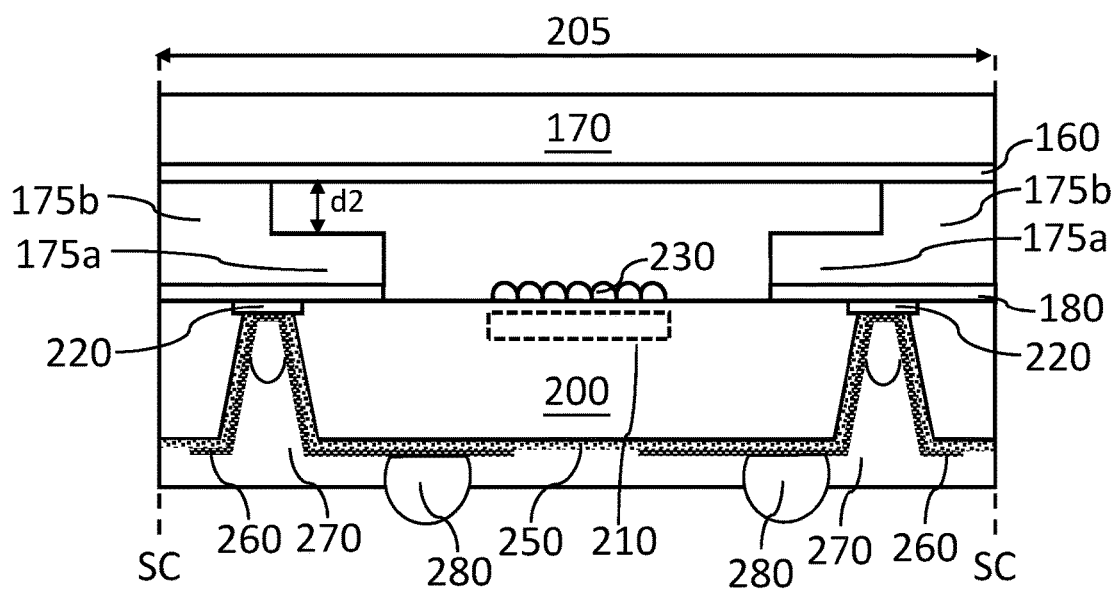

Next, please refer to FIG. 1J. A passivation layer 270 with a plurality of third through holes (not shown) exposing the re-distribution layer 260 was formed on insulating layer 250 and the re-distribution layer 260. The passivation layer 270 of this embodiment can be selected from a group consisting of epoxy, inorganic material such as silicon oxide, silicon nitride, silicon oxynitride, metal oxide or combination thereof, and organic polymer such as polyimide resin, benzocyclobutadiene, poly-p-xylene, naphthalene polymer, fluorocarbon compound, acrylate, solder mask or other suitable insulating materials. Next, a plurality conductive structures 280 were respectively formed in each of the third through holes (not shown) to respectively interconnected to each conductive pad 220 via the re-distribution layer 260.

Figure 1K:
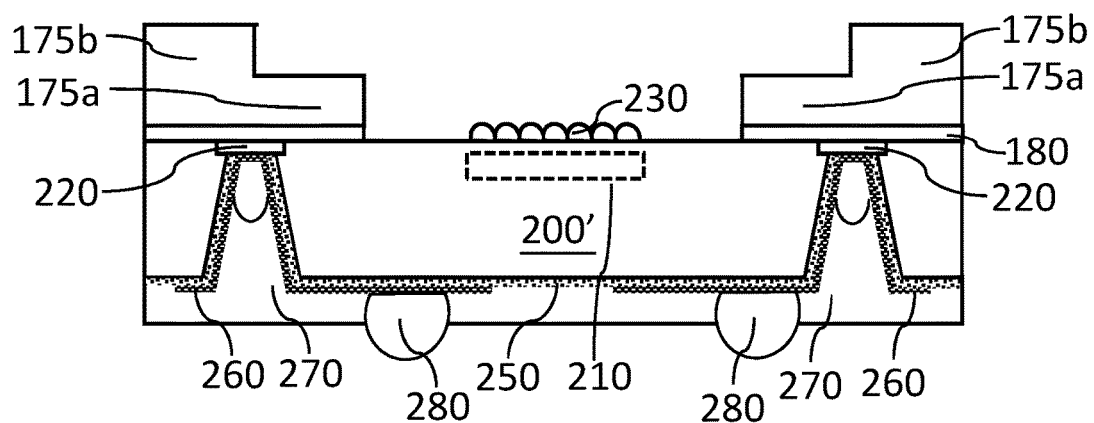

Next, please refer to FIG. 1K. The sensing device wafer 200, the dam 175, the second adhesive layer 160 and the temporary substrate 170 were scribed along the scribing channels SC. A plurality of chip scale sensing chip packages 1000 as shown in FIG. 1K can be generated after removing the second adhesive layer 160 and the temporary substrate 170. Each chip scale sensing chip package 1000 comprises a chip scale sensing chip 200' having a sensing device 210 adjacent to the first top surface 200a and a plurality of conductive pads 220 adjacent to the first top surface 200a and the sensing device 210.

Figure 1L:
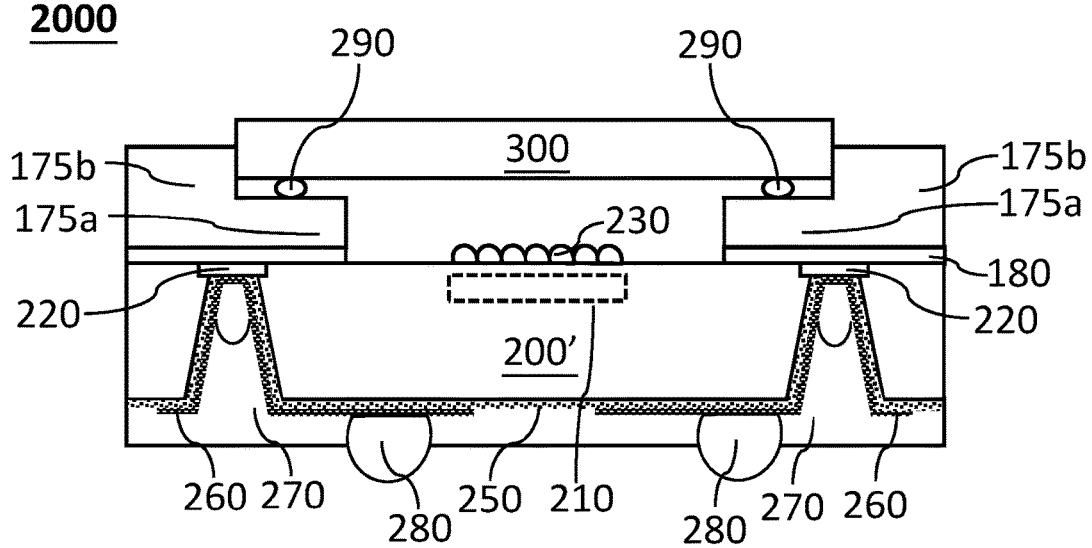

Finally, please refer to FIG. 1L. An optical filter 300 was attached onto the supporter 175a of the dam 175 of each chip scale sensing chip package 1000 by sandwiched a third adhesive layer 290 therebetween to generate a chip scale sensing chip package 2000 as shown in FIG. 1L. The optical filter 300 is deposed above the lens 230 to filter the light with a specific wavelength. The optical filter 300 this embodiment is an IR-filtering glass used to filter the IR, and other glass which can filter UV light, blue light or other visible lights can also be chosen in other embodiments of this invention.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip scale sensing chip package, comprising:
   a sensing chip with a first top surface and a first bottom surface opposite to each other, comprising:
   a sensing device adjacent to the first top surface; and
   a plurality of conductive pads adjacent to first top surface and the sensing device;
   a wiring layer formed on the first bottom surface and connected to each of the conductive pads;
   a dam having a supporter with a first opening and a spacer with a second opening formed on the first top surface, wherein the supporter is within the second opening and adjacent to the spacer, and the spacer is higher than the supporter by a predetermined distance d;
   a lens formed on the first top surface exposed by the first opening and above the sensing device; and
   an optical filter deposed on the supporter and above the lens.

2. The chip scale sensing chip package as claimed in claim 1, wherein the wiring layer comprises:
   a plurality of first through holes formed on the first bottom surface, wherein each of the first through holes corresponding to one of the conductive pad comprises a bottom wall exposing one of the conductive pads and a sidewall surrounding the bottom wall;
   an insulating layer formed on the first bottom surface and overlaid the sidewall and the bottom wall of each first through hole;
   a plurality of second through hole passing through the insulating layer on each of the first through holes and exposing one of the conductive pads corresponding thereof;
   a re-distribution layer formed on the insulating layer and electrically connected to each of the conductive pads via each first through hole and each second through hole;
   a passivation layer formed on the re-distribution layer and having a plurality of third through holes exposing the re-distribution layer; and
   a plurality conductive structures respectively formed in each of the third through holes to respectively interconnected to re-distribution layer.

3. The chip scale sensing chip package as claimed in claim 1, wherein the conductive structures are selected from solder balls, solder bumps or conductive pillars, or combination thereof.

4. The chip scale sensing chip package as claimed in claim 1, further comprising a first adhesive layer sandwiched between the chip scale sensing chip and the dam.

5. The chip scale sensing chip package as claimed in claim 1, further comprising a third adhesive layer sandwiched between the lens and the supporter of the dam.

6. The chip scale sensing chip package as claimed in claim 1, wherein the dam is manufactured by photolithography and etching, molding or injection molding.

7. The chip scale sensing chip package as claimed in claim 1, wherein the dam is made of a material comprising silicon.

8. The chip scale sensing chip package as claimed in claim 1, wherein the optical filter is an IR-filtering glass.

9. The chip scale sensing chip package as claimed in claim 1, wherein the cross-section areas of each first through hole are increased from the first top surface to the first bottom surface.

10. The chip scale sensing chip package as claimed in claim 1, wherein the cross-sectional areas of each first through hole from the first top surface to the first bottom surface are substantial the same.

* * * * *